United States Patent
Wang et al.

(10) Patent No.: US 12,050,888 B2
(45) Date of Patent: Jul. 30, 2024

(54) IN-MEMORY COMPUTING METHOD AND APPARATUS

(71) Applicant: MACRONIX International Co., Ltd., Hsinchu (TW)

(72) Inventors: Wei-Chen Wang, Taipei (TW); Chien-Chung Ho, Chiayi County (TW); Yuan-Hao Chang, Taipei (TW); Tei-Wei Kuo, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 793 days.

(21) Appl. No.: 17/217,482

(22) Filed: Mar. 30, 2021

(65) Prior Publication Data

US 2021/0326114 A1    Oct. 21, 2021

Related U.S. Application Data

(60) Provisional application No. 63/010,050, filed on Apr. 15, 2020.

(51) Int. Cl.
*H03M 5/00*     (2006.01)
*G06F 7/544*    (2006.01)
(Continued)

(52) U.S. Cl.
CPC ............ *G06F 7/5443* (2013.01); *G06F 7/768* (2013.01); *G06N 3/04* (2013.01); *G06N 3/08* (2013.01);
(Continued)

(58) Field of Classification Search
CPC .......... H03M 7/24; H03M 7/04; G11C 7/1036
(Continued)

(56) References Cited

U.S. PATENT DOCUMENTS 11,783,875 B2 * 10/2023 Seok .................. G11C 16/3404
                                                             365/189.15
2019/0065151 A1   2/2019 Chen et al.
(Continued)

FOREIGN PATENT DOCUMENTS

| TW | 201822203 | 6/2018 |
| TW | 201944423 | 11/2019 |
| TW | 202013213 | 4/2020 |

OTHER PUBLICATIONS

"Office Action of Taiwan Counterpart Application", issued on Mar. 21, 2022, p. 1-p. 3.

(Continued)

*Primary Examiner* — Peguy Jean Pierre
(74) *Attorney, Agent, or Firm* — J.C. PATENTS (57) ABSTRACT

An in-memory computing method and apparatus, adapted for a processor to perform MAC operations on a memory, are provided. In the method, a format of binary data of weights is transformed from a floating-point format into a quantized format by truncating at least a portion of fraction bits of the binary data and calculating complements of remaining bits, and programming the transformed binary data into cells of the memory. A tuning procedure is performed by iteratively inputting binary data of input signals into the memory, integrating outputs of the memory, and adjusting the weights programmed to the cells based on the integrated outputs. The binary data of the weights is reshaped based on a probability of reducing bits with a value of one in the binary data of each weight. The tuning procedure is repeated until an end condition is met.

16 Claims, 6 Drawing Sheets

(51) Int. Cl.
  *G06F 7/76* (2006.01)
  *G06N 3/04* (2023.01)
  *G06N 3/08* (2023.01)
  *G11C 13/00* (2006.01)
  *H03M 7/04* (2006.01)
  *H03M 7/24* (2006.01)

(52) U.S. Cl.
  CPC ............ *G11C 13/004* (2013.01); *H03M 7/04* (2013.01); *H03M 7/24* (2013.01)

(58) Field of Classification Search
  USPC ........................................... 341/55, 50, 106
  See application file for complete search history.

(56) References Cited

U.S. PATENT DOCUMENTS

2019/0102170 A1  4/2019  Chen et al.
2019/0370639 A1  12/2019  Yu

OTHER PUBLICATIONS

Itay Hubara et al., "Quantized Neural Networks: Training Neural Networks with Low Precision Weights and Activations", Quantized Neural Networks, arXiv:1609.07061, Sep. 22, 2016, pp. 1-29.
Mohammad Rastegari et al., "XNOR-Net: ImageNet Classification Using Binary Convolutional Neural Networks", Computer Science, arXiv:1603.05279, Aug. 2, 2016, pp. 1-17.

* cited by examiner

IN-MEMORY COMPUTING METHOD AND APPARATUS

CROSS-REFERENCE TO RELATED APPLICATION

This application claims the priority benefit of U.S. provisional application Ser. No. 63/010,050, filed on Apr. 15, 2020. The entirety of the above-mentioned patent application is hereby incorporated by reference herein and made a part of this specification.

BACKGROUND

Field of the Disclosure

The present disclosure relates to a computing method and a computing apparatus, and more particularly to an in-memory computing method and an in-memory computing apparatus.

Description of Related Art

Recurrent neural networks (RNNs), compared with traditional machine learning approaches, have shown its capability to achieve greater accuracy on several domains such as image recognition and speech enhancement. However, several challenges have emerged on performing RNN over the current Von-Neumann architecture. For example, in fully-connected-like neural networks, the excessive data movement between processing units and off-chip memory units on performing RNN incurs the performance limitation and high power consumption.

To bridge the gap between computing and memory units, the concept of in-memory computing is widely advocated, and the memristor with Resistive Random-Access Memory (ReRAM) IS one of the most intensively-studied solutions. ReRAM, one of emerging non-volatile memories (NVMs), memorizes data by changing the resistance of cells and are proved to possess both capabilities of computing and memorizing. Specifically, the memristor performs digital RNN operations, i.e., Multiply-and-Accumulate (MAC) operations, on the analog aspect by setting different input voltages and resistance values to represent input and weight values, respectively.

Figure 1:
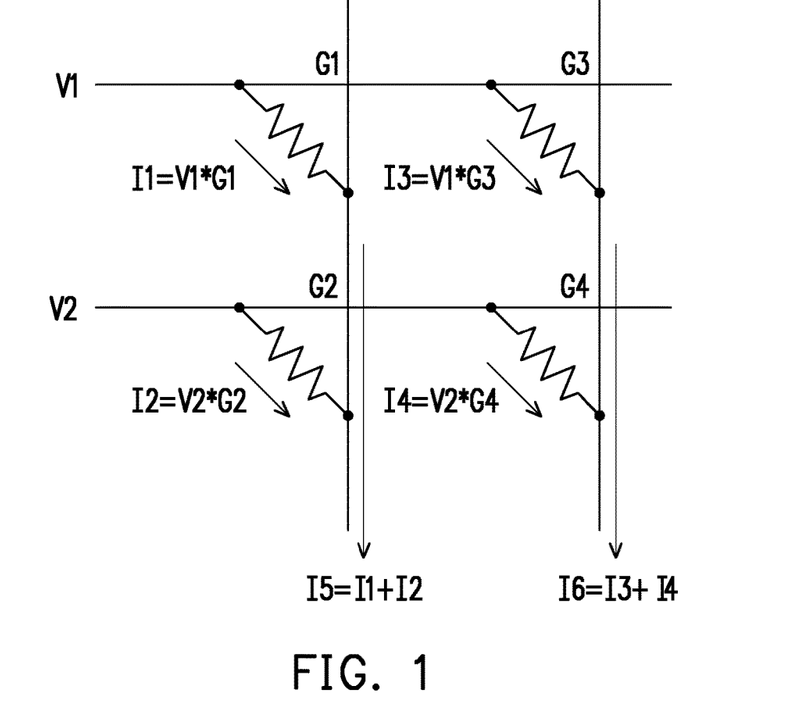
FIG. 1 shows an example of performing the computation of MAC operations by using a memristor.

For example, FIG. 1 shows an example of performing the computation of MAC operations by using a memristor, and this example aims to calculate the result of $\Sigma(V_n \times G_n)$. In this example, each wordline is connected to each bitline by a ReRAM cell at the cross point in the 3D space. By Kirchhoff's current law (KCL), given voltages V1 and V2 to the corresponding wordlines, the emerged electric currents I1, I2, I3, I4 of each ReRAM cell induced by conductance G1, G2, G3, G4 are summed to currents I5 and I6 on the corresponding bitlines instantaneously. The results of the MAC operations are retrieved simultaneously by sensing currents on each bitline, where the value of I5 equals to V1×G1+V2×G2 and the value of I6 equals to V1×G3+V2×G4.

However, due to the overlapped distribution of the summed current in memristors, an accuracy of the RNN decreases dramatically.

Figure 2:
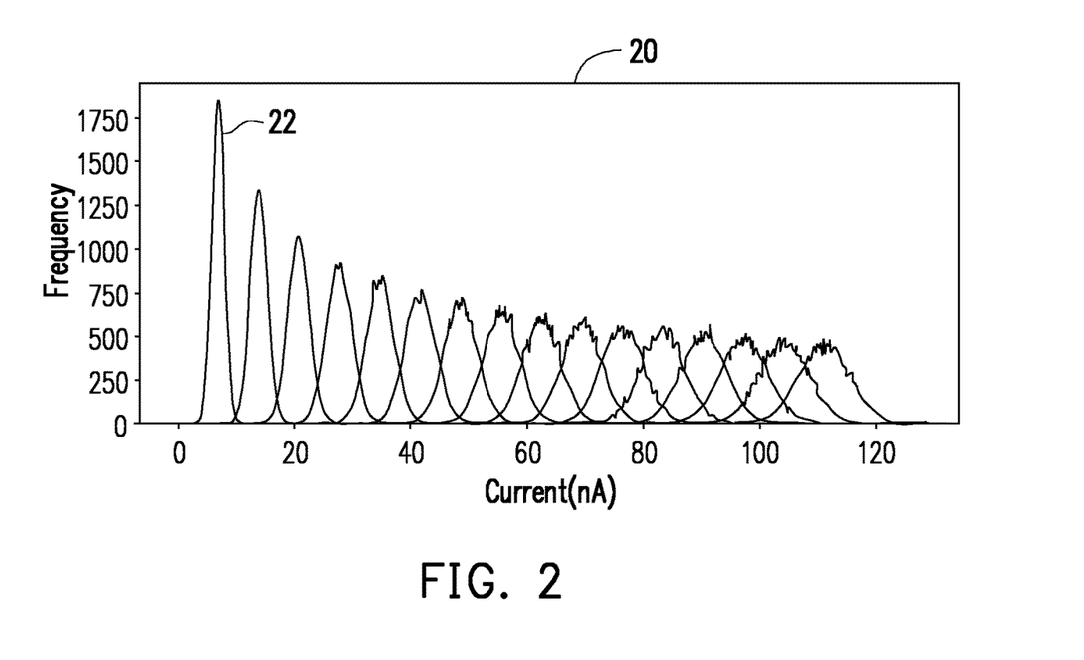
FIG. 2 shows distributions of the output current for all cells in a memristor.

For example, FIG. 2 shows distributions of the output current for all cells in a memristor. When a predefined voltage is applied to the input lines, possible distributions of the output current for all cells is shown in a diagram 20 in which the x-axis denotes the current and the y-axis denotes the frequency. The distributions become wider while more cells are involved in the MAC operation. As shown in FIG. 2, when 16 cells are involved in the MAC operation, 17 possible combinations of input values may be presented by the distributions shown in the diagram 20, in which a distribution 22 shown on the left of the diagram 20 may present a value of zero and the distribution becomes wider when the summed current becomes greater. As a result, the probability of the overlapping variation error becomes higher.

SUMMARY

In view of the above, the present disclosure provides an in-memory computing method and an in-memory computing apparatus capable of reducing the overlapping variation error and increasing the accuracy of computation.

The present disclosure provides an in-memory computing method, adapted for a processor to perform multiply-and-accumulate (MAC) operations on a memory. The memory comprises a plurality of input lines and a plurality of output lines crossing each other, a plurality of cells respectively disposed at intersections of the input lines and the output lines, and a plurality of sense amplifiers respectively connected to the output lines. In the method, a format of binary data of a plurality of weights is transformed from a floating-point format into a quantized format by truncating at least a portion of fraction bits of the binary data and calculating complements of remaining bits of the binary data, and programming the transformed binary data of the plurality of weights into the plurality of cells. A tuning procedure is performed by iteratively inputting binary data of a plurality of input signals into the plurality of input lines, integrating outputs sensed by the sense amplifiers, and adjusting the binary data of the plurality of weights programmed into the cells based on the integrated outputs for a number of iterations. The binary data of the plurality of weights is reshaped based on a probability of reducing bits with a value of one in the binary data of each weight after the number of iteration. The tuning procedure is repeated until an end condition is met.

In an embodiment of the disclosure, the step of calculating complements of remaining bits of the binary data comprises calculating 2's complements of the remaining bits and reversing values of the calculated 2's complements.

In an embodiment of the disclosure, the step of adjusting the binary data of the plurality of weights programmed into the cells based on the integrated outputs comprises calculating differences between the integrated outputs and reference signals of the input signals, and adjusting the transformed binary data of the plurality of weights to be programmed into the cells according to the differences.

In an embodiment of the disclosure, the step of reshaping the binary data of the plurality of weights based on a probability of reducing the bits with a value of one in the binary data of each weight comprises calculating an accuracy according to the differences between the integrated outputs and reference signals of the input signals, and advancing the reshaping in response to the calculated accuracy being greater than a first threshold.

In an embodiment of the disclosure, the step of reshaping the binary data of the plurality of weights based on a probability of reducing the bits with a value of one in the binary data of each weight comprises calculating a ratio of the bits with a value of one and the bits with a value of zero in the binary data of the plurality of weights, and advancing the reshaping in response to the calculated ratio being greater than a second threshold.

In an embodiment of the disclosure, the step of reshaping the binary data of the plurality of weights based on a probability of reducing the bits with a value of one in the binary data of each weight comprises calculating the probability by shifting a decimal value of each weight by an arbitrary number to maximize a quotient of a reduction of bits with a value of one in the binary data of the weight and the shifted number, and dividing the quotient by a factor determined based on a data distribution of the plurality of weights, and shifting the decimal value of each weight according to the calculated probability in response to the quotient being larger than or equal to a threshold.

The present disclosure provides an in-memory computing apparatus comprising a memory and a processor. The memory comprises a plurality of input lines and a plurality of output lines crossing each other, a plurality of cells respectively disposed at intersections of the input lines and the output lines, and a plurality of sense amplifiers respectively connected to the output lines. The processor is coupled to the memory and configured to transform a format of binary data of a plurality of weights from a floating-point format into a quantized format by truncating at least a portion of fraction bits of the binary data and calculating complements of remaining bits of the binary data, and program the transformed binary data of the plurality of weights into the plurality of cells; perform a tuning procedure by iteratively inputting binary data of a plurality of input signals into the plurality of input lines, integrate outputs sensed by the sense amplifiers, and adjusting the binary data of the plurality of weights programmed into the cells based on the integrated outputs for a number of iterations; and reshape the binary data of the plurality of weights based on a probability of reducing bits with a value of one in the binary data of each weight after the number of iteration, and repeat the tuning procedure until an end condition is met.

In an embodiment of the disclosure, the processor calculates 2's complements of the remaining bits and reverses values of the calculated 2's complements.

In an embodiment of the disclosure, the processor calculates differences between the integrated outputs and reference signals of the input signals, and adjusts the transformed binary data of the plurality of weights to be programmed into the cells according to the differences.

In an embodiment of the disclosure, the processor calculates an accuracy according to the differences between the integrated outputs and reference signals of the input signals, and advances the reshaping in response to the calculated accuracy being greater than a first threshold.

In an embodiment of the disclosure, the processor calculates a ratio of the bits with a value of one and the bits with a value of zero in the binary data of the plurality of weights, and advances the reshaping in response to the calculated ratio being greater than a second threshold.

In an embodiment of the disclosure, the processor calculates the probability by shifting a decimal value of each weight by an arbitrary number to maximize a quotient of a reduction of bits with a value of one in the binary data of the weight and the shifted number, and dividing the quotient by a factor determined based on a data distribution of the plurality of weights, and shifting a decimal value of each weight according to the calculated probability in response to the quotient being larger than or equal to a threshold.

In an embodiment of the disclosure, the binary data of the plurality of input signals are set as inputs of the neural network, the plurality of weights are set as weights in a plurality of computing layers in the neural network, and the integrated outputs are set as outputs of the neural network.

In an embodiment of the disclosure, the binary data of each weight with the floating-point format comprises one sign bit, eight exponent bits and twenty-three fraction bits in a 32-bit floating-point format.

In order to make the aforementioned features and advantages of the disclosure more comprehensible, embodiments accompanying figures are described in detail below.

DESCRIPTION OF EMBODIMENTS

Due to the resistance programming variation, the memristor suffers from the overlapping variation error while it converts the output current into a digital output in each MAC operation. As shown in FIG. 2, the distribution of the output current becomes wider when the output current becomes greater, and accordingly the probability of the overlapping variation error becomes higher. Therefore, it is better to reduce the output current so as to make the distributions more distinct from each other. One way to reduce the output current is to increase a number of bits "0" (or reducing a number of bits "1") to be programmed into the cells of the memristor.

Based on the above, in the embodiments of the present disclosure, an adaptive computation method is proposed to transform a format of binary data of weights to be programmed to the memristor from a floating-point format into a quantized format and further reshape the binary data of the weights after a number of iterations of weight tuning procedure, so as to reduce the number of bits "1" in the binary data of each weight and significantly reduce the occurrence of the overlapping variation error.

Figure 3:
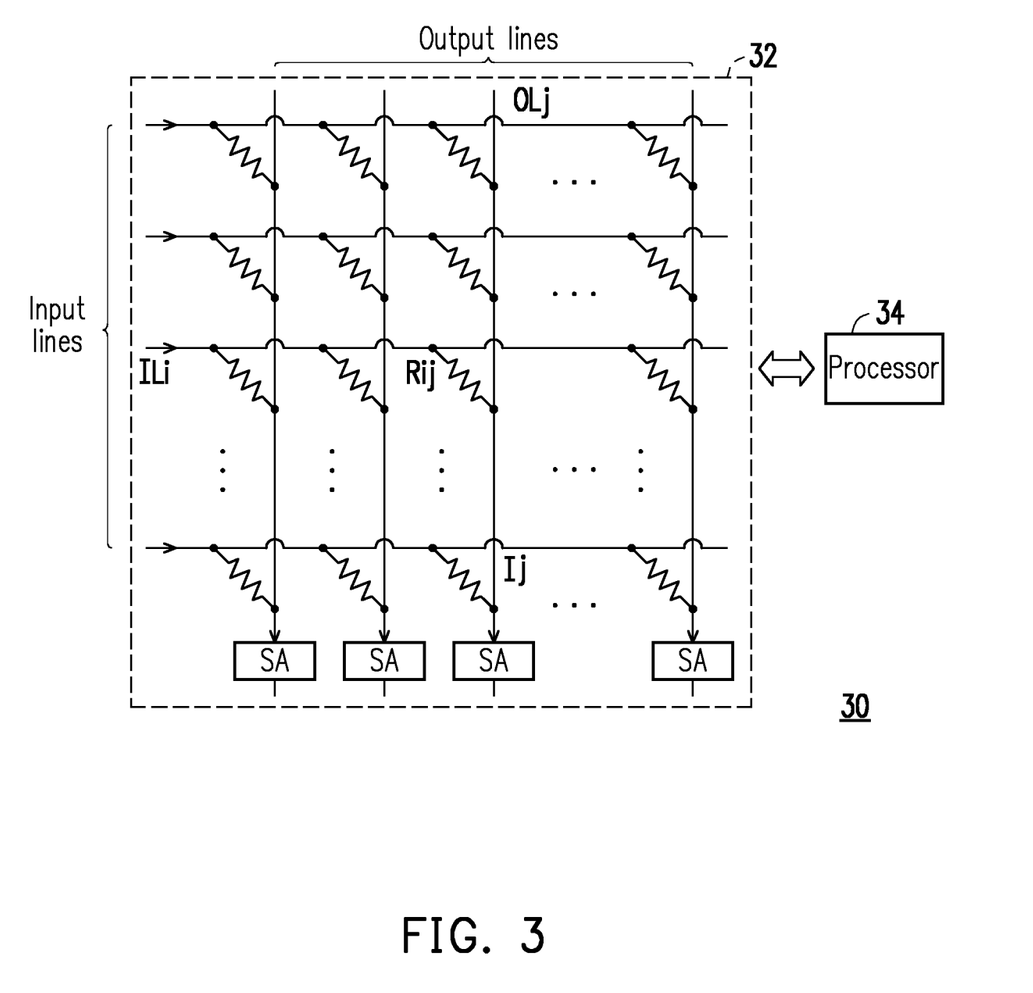
FIG. 3 is a schematic diagram of an in-memory computing apparatus according to an embodiment of the disclosure.

FIG. 3 is a schematic diagram of an in-memory computing apparatus according to an embodiment of the disclosure. Referring to FIG. 3, the in-memory computing apparatus 30 of the embodiment is, for example, a memristor configured to realize process-in-memory (PIM) so as to reduce the summed current output by cells of the memristor. The computing apparatus 30 comprises a memory 32 and a processor 34.

The memory 32 is, for example, NAND flash, NOR flash, phase change memory (PCM), spin-transfer torque random-access memory (STT-RAM), or resistive random-access memory (ReRAM) of 2D or 3D structure, which is not limited herein. In some embodiments, various volatile memories, such as static random access memory (RAM), dynamic RAM, and various nonvolatile memories such as ReRAM, PCM, flash, magnetoresistive RAM, ferroelectric RAM may be integrated to perform the in-memory computing, which is not limited herein.

The memory 32 comprises a plurality of input lines $IL_i$ and a plurality of output lines $OL_j$ crossing each other, a plurality of cells (represented by resistance $R_{ij}$) respectively disposed at intersections of the input lines $IL_i$ and the output lines $OL_j$, and a plurality of sense amplifiers SA respectively connected to the output lines $OL_j$ for sensing the currents $I_j$ output from the output lines $OL_j$. In some embodiments, the input lines $IL_i$ are wordlines while the output lines $OL_j$ are bitlines, and in some embodiments, the input lines $IL_i$ are bitlines while the output lines $OL_j$ are wordlines, which is not limited herein.

The processor 34 is, for example, a central processing unit (CPU), or other programmable general-purpose or specific-purpose microprocessor, microcontroller (MCU), programmable controller, application specific integrated circuits (ASIC), programmable logic device (PLD) or other similar devices or a combination of these devices; the embodiment provides no limitation thereto. In the present embodiment, the processor 34 is configured to execute instructions for performing the in-memory computing as described below. The in-memory computing may be implemented to various artificial intelligent (AI) applications such as fully connection layer, convolution lay, multiple layer perception, support vector, or other applications that implement the memristor, which is not limited herein.

Figure 4:
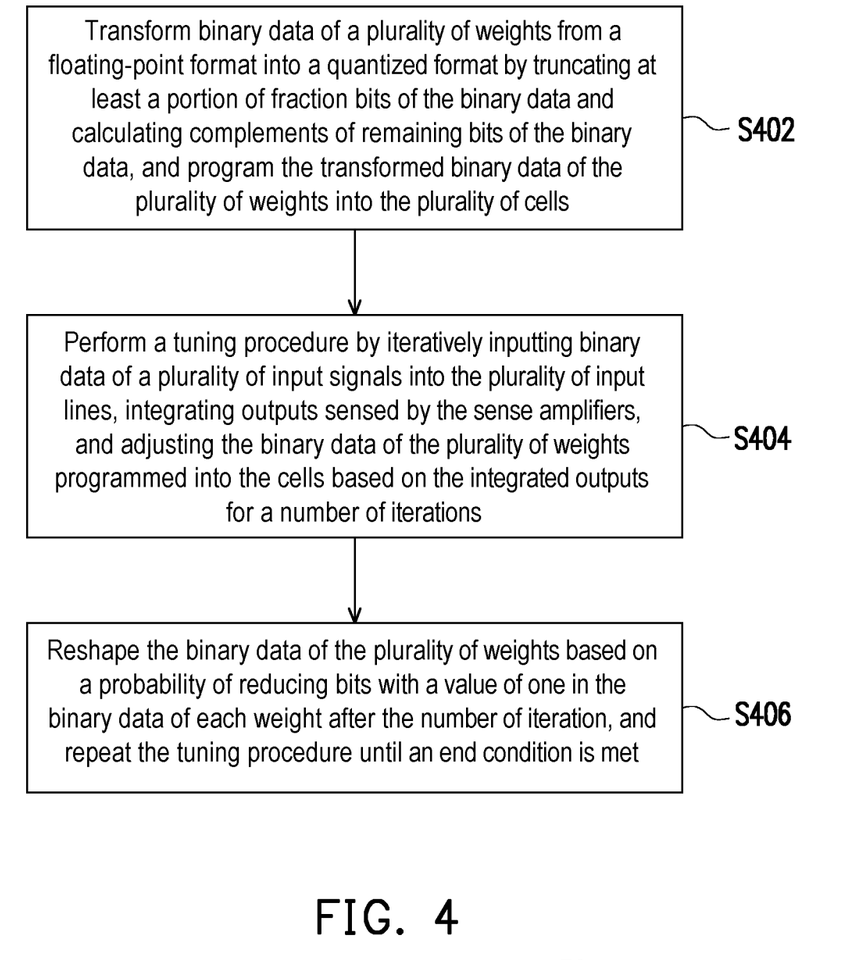
FIG. 4 is a flow chart of an in-memory computing method according to an embodiment of the disclosure.

FIG. 4 is a flow chart of in-memory computing method according to an embodiment of the disclosure. Referring to FIG. 3 and FIG. 4, the method of the present embodiment is adaptable for the above-mentioned computing apparatus 30, and the detailed steps of the computing method of the present embodiment will be described below with reference to the various devices and components of the computing apparatus 30.

First, in step S402, the processor 34 transforms a format of binary data of a plurality of weights from a floating-point format into a quantized format by truncating at least a portion of fraction bits of the binary data and calculating complements of remaining bits of the binary data, and programs the transformed binary data of the plurality of weights into the plurality of cells. In some embodiments, the binary data of each weight with the floating-point format comprises one sign bit, eight exponent bits and twenty-three fraction bits in a 32-bit binary data, and the processor 34 may truncate all twenty-three fraction bits, or a portion of those fraction bits, so as to reduce a number of bits "1".

In some embodiments, the processor 34 may calculate 2's complements of the remaining bits after the truncation and reverse values of the calculated 2's complements, so as to reduce the number of bit "1" and maximize the number of bit "0", and accordingly reduce the overlapping variation error.

Figure 5:
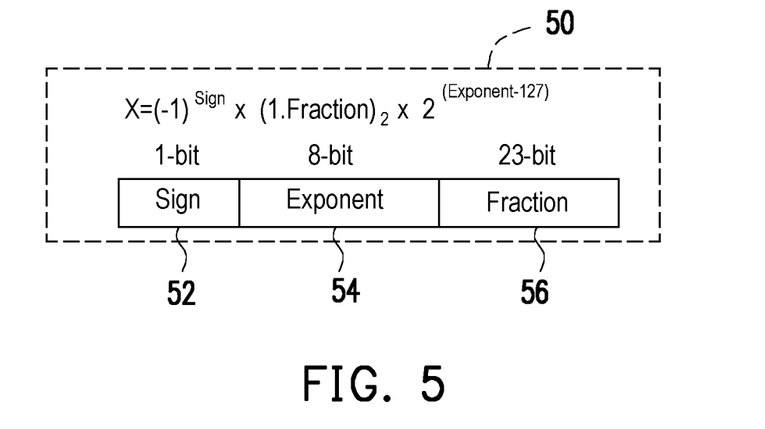
FIG. 5 is a floating-point format of binary data according to an embodiment of the disclosure.

For example, FIG. 5 is a floating-point format of binary data according to an embodiment of the disclosure. Referring to FIG. 5, the floating-point format 50 of a 32-bit binary data X is a format standardized by the IEEE organization and includes one sign bit 52, eight exponent bits 54 and twenty-three fraction bits 56. In detail, a sign of a 32-bit binary data is represented by a single bit, in which the bit "0" indicates a negative number, and the bit "1" indicates a positive number. The exponents of the 32-bit binary data are stored as 8-bit unsigned integers with a bias of 127. The mantissa of the 32-bit binary data is stored as 23-bit unsigned integers. Taking a number of $1.101 \times 2^5$ as an example, the sign is positive, the mantissa is "1.101", and the exponent is "5".

In some embodiment, in a full-precision training, a ratio of bit "0" is close to a ratio of bit "1". When the binary data is quantized to 9-bit (i.e. all the fraction bits are truncated), a ratio of bit "0" is reduced and a ratio of bit "1" is increased, while the training error is not significantly affected by the quantization. As the ratio of bit "1" is increased when the binary data is quantized, a method for flipping the value of bit "1" is proposed to reduce the number of bit "1" and maximize the number of bit "0", so as to reduce the overlapping variation error and increase the accuracy of training.

In some embodiments, a method called "reversed 2's complements" is performed, in which 2's complements of the 8-bit exponent in the binary data of the floating-point format are calculated and the values of the calculated 2's complements are reversed. For example, for a decimal value "−1", a 2's complement of the exponent of "−1" is "01111110", and a reversed 2's complements is "00000001", which includes less bits "1".

Figure 6A:
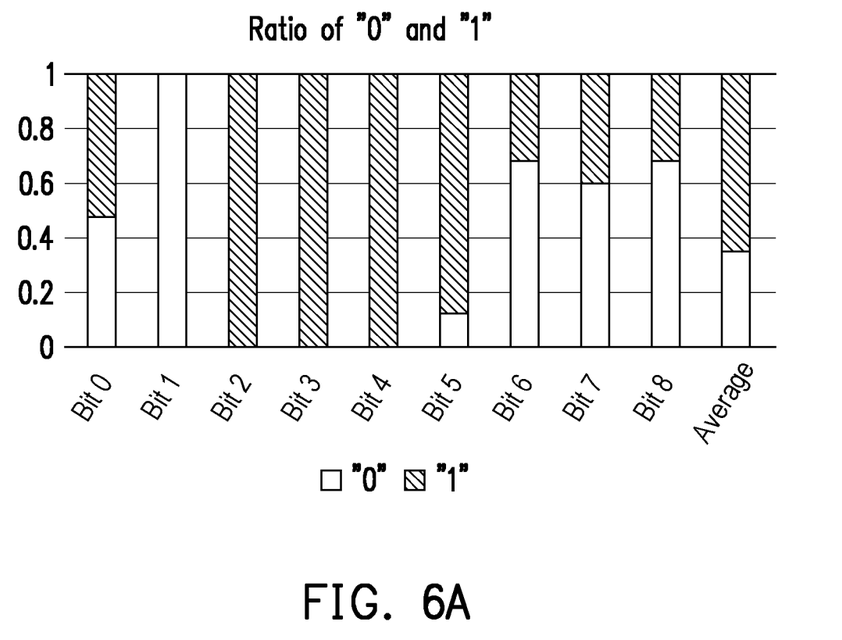
FIG. 6A and FIG. 6B are schematic diagrams respectively showing ratios of bit "0" and bit "1" in the quantized 9-bit binary data and in the reversed quantized 9-bit binary data according to an embodiment of the disclosure.
Figure 6B:
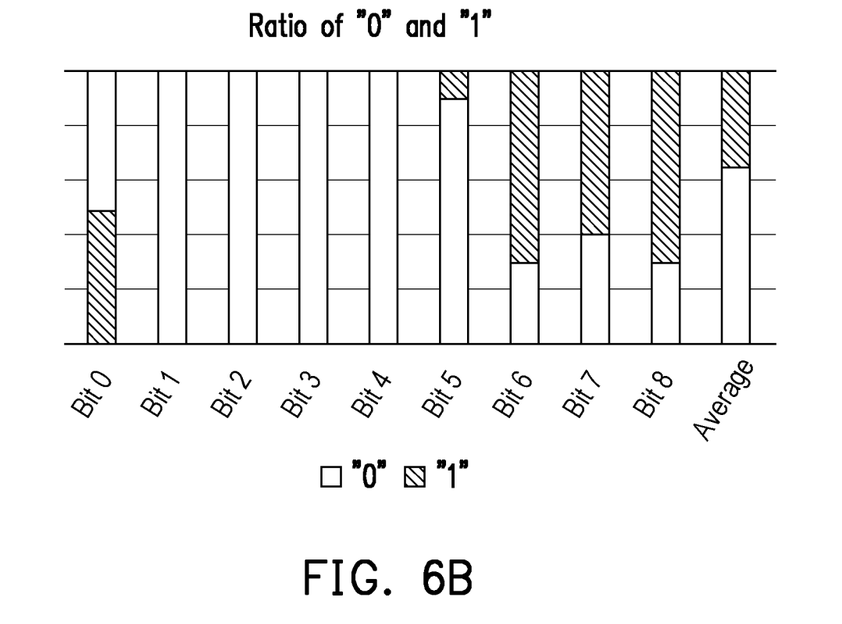

FIG. 6A and FIG. 6B are schematic diagrams respectively showing ratios of bit "0" and bit "1" in the quantized 9-bit binary data and in the reversed quantized 9-bit binary data according to an embodiment of the disclosure. FIG. 6A illustrates the ratio of bit "0" and bit "1" for each bit in the quantized 9-bit binary data, in which in most bits of the quantized 9-bit binary data, the ratio of bit "1" is greater than the ratio of bit "0", especially in Bit 2 to Bit 5. Referring to FIG. 6B, as the bits of the quantized 9-bit binary data in FIG. 6A are reversed, the ratio of bit "0" becomes greater than the ratio of bit "1", especially in Bit 2 to Bit 5. Regarding Bit 6 to Bit 8, a method of data reshaping is proposed to further reduce the ratio of bit "1", which will be illustrated later.

Returning back to the flow of FIG. 4, in step S404, the processor 34 performs a tuning procedure by iteratively inputting binary data of a plurality of input signals into the plurality of input lines $IL_i$, integrating outputs (i.e. currents $I_j$) sensed by the sense amplifiers SA, and adjusting the binary data of the plurality of weights programmed into the cells based on the integrated outputs for a number of iterations.

In some embodiments, the tuning procedure comprises training of a neural network in which the binary data of the plurality of input signals are set as inputs of the neural network, the plurality of weights are set as weights in a plurality of computing layers in the neural network, and the integrated outputs are set as outputs of the neural network.

Figure 7:
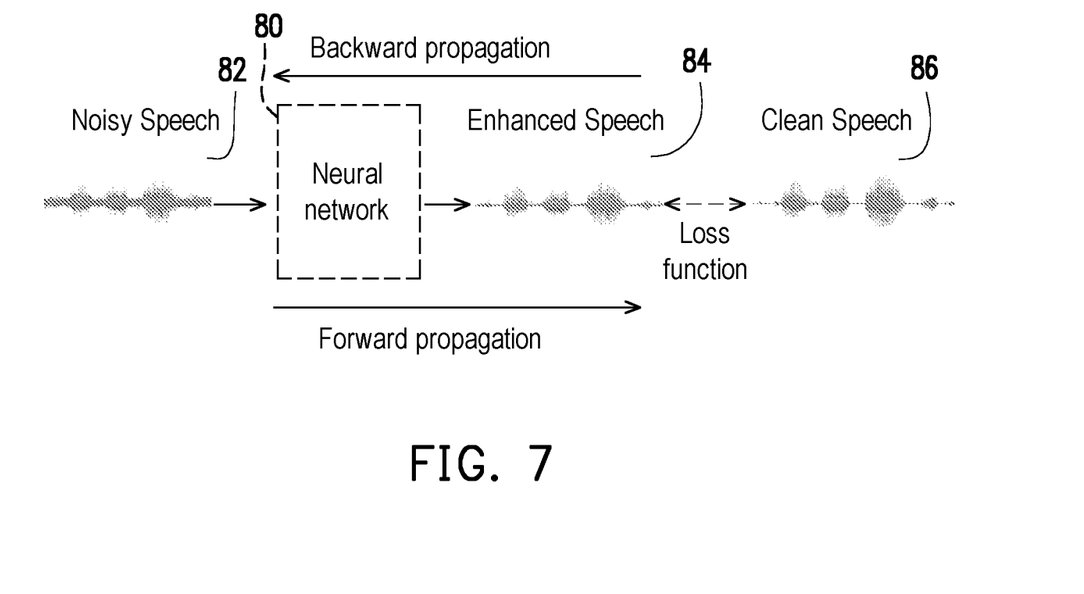
FIG. 7 is a schematic diagram illustrating training of a neural network according to an embodiment of the disclosure.

For example, FIG. 7 is a schematic diagram illustrating training of a neural network according to an embodiment of the disclosure. Referring to FIG. 7, a fully-connected neural network 80, such as recurrent neural network (RNN), deep neural network (DNN), or fully convolutional network (FCN), is created with multiple intermediate layers between an input layer and an output layer, and with a plurality of weights set to those layers. According to the computation method illustrated above, a format of the weights in the neural network 80 is transformed into the quantized format and then programmed to the cells of the memory. Multiple noisy speech signals 82 serving as the input signals are input to the input lines of the memory to perform a forward propagation in the neural network. The speech signals 82 being processed by the neural network 80 are output as enhanced speech signals 84 and compared with clean speech signals 86 serving as reference signals of the speech signals 82 to calculate the loss function such as mean-square errors. Then, a backward propagation in the neural network 80 is performed to adjust the weights set in the computing layers of the neural network 80. The adjusted weights are programmed to the cells of the memory for next iteration of training. In some embodiments, the training is performed for many iterations, so as to make the enhanced speech signals 84 output by the neural network 80 be close to the clean speech signals 86, such that the trained neural network 80 can be used to filter the noise from any speech signal input to the neural network 80 in practical implementation.

Returning back to the flow of FIG. 4, in step S406, the processor 34 reshapes the binary data of the plurality of weights based on a probability of reducing bits with a value of one in the binary data of each weight after the number of iteration, and repeats the tuning procedure until an end condition is met.

In some embodiments, the processor 34 calculates the probability by shifting a decimal value of each weight by an arbitrary number to maximize a quotient of a reduction of bits with a value of one in the binary data of the weight and the shifted number, and dividing the quotient by a factor determined based on a data distribution of the plurality of weights, and shifts a decimal value of the weight in response to the calculated probability for the weight being greater than a threshold.

Figure 8:
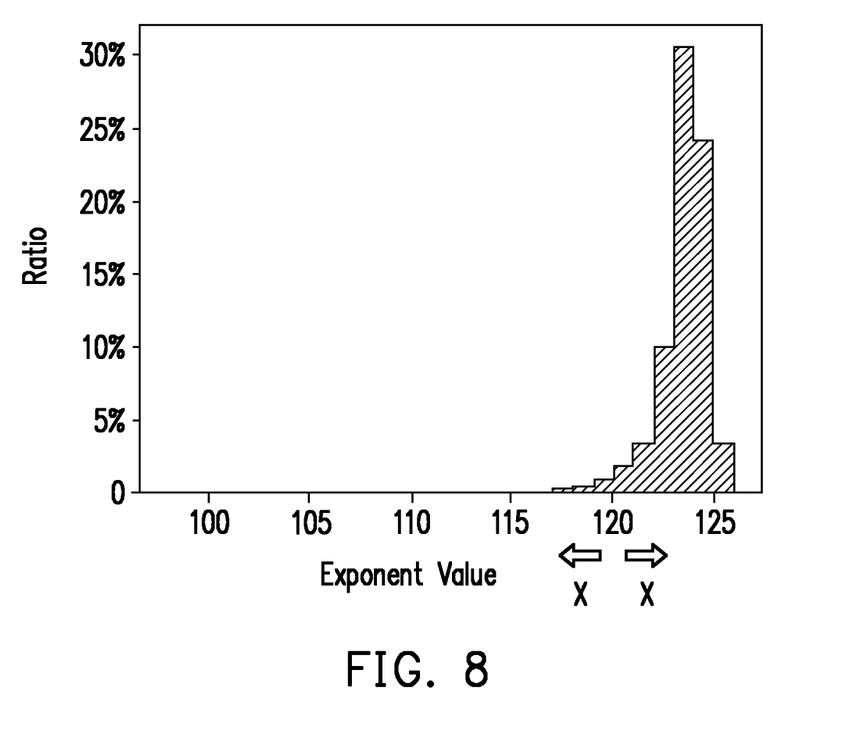
FIG. 8 is a schematic diagram illustrating data reshaping according to an embodiment of the disclosure.

For example, FIG. 8 is a schematic diagram illustrating data reshaping according to an embodiment of the disclosure. Referring to FIG. 8, assuming a decimal value of 120 is an exponent value of the weight obtained after iterations of the tuning procedure, the exponent value may be shifted by an arbitrary number (e.g. an integer less than a threshold X) to obtain a shifted value such as 117 or 123. Accordingly, a reduction r of bits "1" in the binary data of the shifted exponent value and a shifted number x of the exponent value in decimal are respectively calculated, and a quotient y of a reduction of bits "1" in the binary data of the weight and the shifted number x is calculated as follows.

$$y = r/x. \quad (1)$$

For example, for a threshold X equal to 3, an exponent value of 120 ("00000110" in binary) may be shifted to 122 ("00000100" in binary). The reduction r of bits "1" is equal to 1 while the shifted number x of the exponent value is equal to 2, and accordingly the quotient y is equal to "½".

To reduce the bits "1" as many as possible, the quotient y should be maximized, and compared with a threshold so as to determine whether to trigger the data reshaping. In some embodiments, the data reshaping is performed based on a possibility P calculated by dividing the calculated quotient y by a factor α determined based on a data distribution of the plurality of weights as follows.

$$P = y \times 100\% / \alpha \quad (2)$$

As for the example of shifting an exponent value of 120 ("00000110" in binary) to 122 ("00000100" in binary) above, the quotient y is equal to ½, and the possibility P=0.5×100%/5=10%, which represents the possibility for performing the data reshaping is 10% and the possibility for not performing the data reshaping is 90%. As the data reshaping is performed based on the possibility, a trade-off among performance and accuracy of the neural network can be well accomplished.

Figure 9:
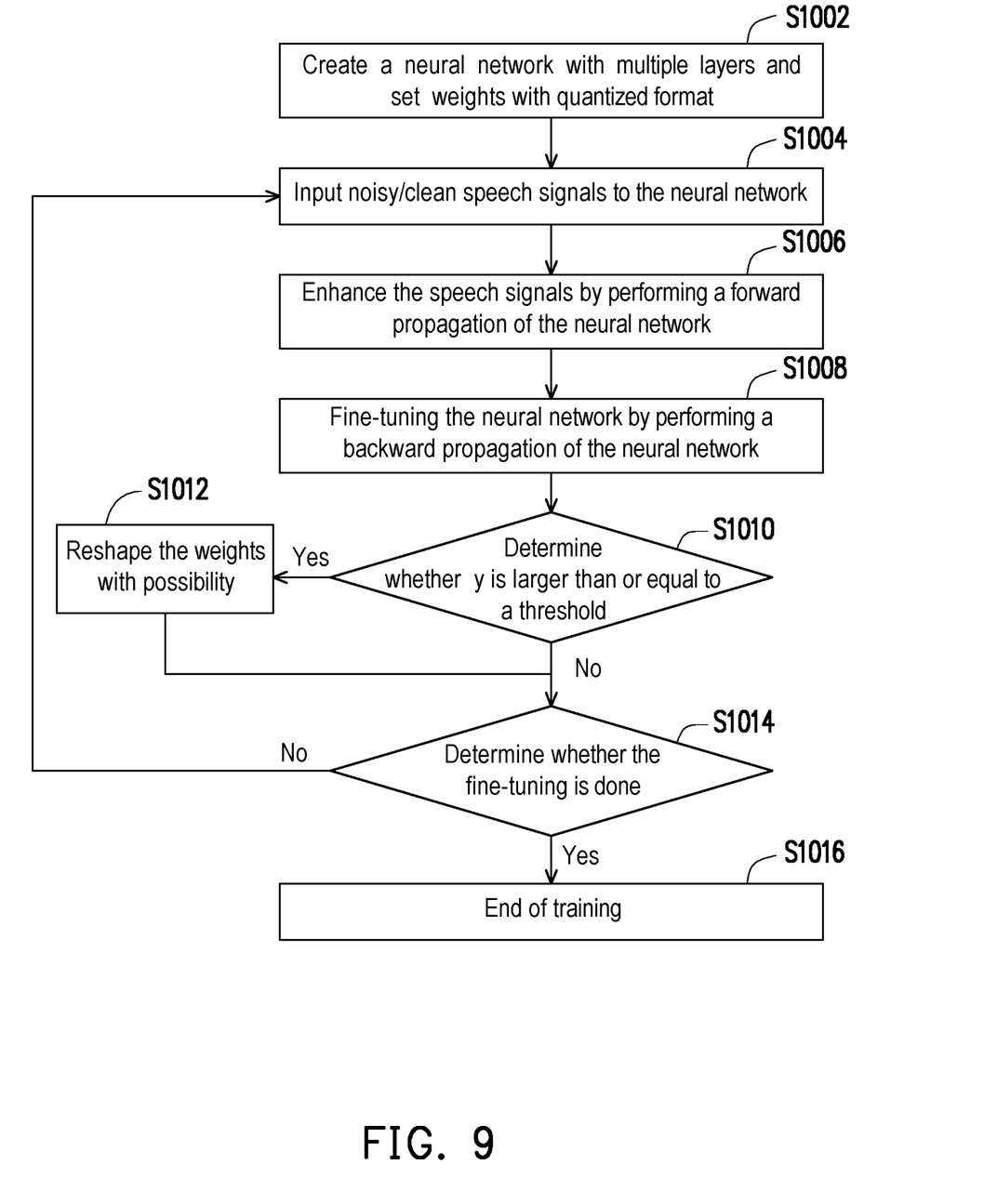
FIG. 9 is a flow chart of an in-memory computing method according to an embodiment of the disclosure.

FIG. 9 is a flow chart of in-memory computing method according to an embodiment of the disclosure. Referring to FIG. 3 and FIG. 9, the method of the present embodiment is adaptable for the above-mentioned computing apparatus 30, and the detailed steps of the computing method of the present embodiment will be described below with reference to the various devices and components of the computing apparatus 30.

In step S1002, the processor 34 creates a neural network with multiple layers and set weights with quantized format as illustrated in above embodiments to those layers.

In step S1004, the processor 34 inputs noisy or clean speech signals to the neural network by transforming the speech signals into digital data and inputting the transformed digital data to the input lines ILi of the memory 32.

In step S1006, the processor 34 enhances the speech signals by performing a forward propagation of the neural network. The transformed digital data input to the input lines ILi of the memory 32 are multiplied by the weights programmed to the cells (represented by resistance $R_{ij}$) of the memory 32, and a summed current sensed by the sense amplifiers SA of the memory 32 is output and transformed into enhanced speech signals.

In step S1008, the processor 34 fine-tunes the neural network by performing a backward propagation of the neural network. In some embodiments, the processor 34 adjusts the weights programmed into the cells of the memory 32 based on comparisons between the enhanced speech signals and reference clean speech signals.

In step S1010, the processor 34 determines whether the quotient y, calculated by using the equation (1) illustrated above, is larger than or equal to a threshold.

In response to the quotient y being larger than or equal to the threshold, in step S1012, the processor 34 reshapes the weights programmed into the cells of the memory 32 with the possibilities calculated by using the equation (2) illustrated above.

In response to the quotient y being not larger than or equal to the threshold or the reshaping of the weights is done, in step S1014, the processor 34 determines whether the fine-tuning is done. In response to determining the fine-tuning has not been done, the processor returns to step S1004 to keep inputting the speech signals for training the neural network. On the other hand, in response to determining the fine-tuning is done, the processor proceeds to step S1016 to end the training.

In some embodiments, the processor 34 may determine whether the fine-tuning is done according to a number of iterations currently performed and determine the fine-tuning is done when the number of iterations reaches a predetermined number. In some embodiments, the processor 34 may determine whether the fine-tuning is done according accuracy calculated based on differences between the output enhanced speech signals and the reference clean speech signals, and determine the fine-tuning is done when the calculated accuracy reaches a predetermined threshold.

In some embodiments, the processor 34 may advance the reshaping in response to some conditions being met. In some embodiments, the processor 34 may calculate accuracy according to differences between the integrated outputs and reference signals of the input signals, and advance the reshaping in response to the calculated accuracy being greater than a first threshold. In some embodiments, the processor 34 may calculate a ratio of the bits "0" and the bits "0" in the binary data of the plurality of weights, and advance the reshaping in response to the calculated ratio being greater than a second threshold.

Through the method described above, the probability of the overlapping variation error can be reduced with limited impact on the model accuracy.

To sum up, according to the embodiments of the present disclosure, an in-memory computing method is proposed to trade the performance, accuracy and data shape on neural network or other applications that implement the memristor. As a result, the model size of the neural network or the computations of application can be shrinked to make the neural network or the applications more practical for edges devices or other resource-constraint hardware.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An in-memory computing method, adapted for a processor to perform multiply-and-accumulate (MAC) operations on a memory, wherein the memory comprises a plurality of input lines and a plurality of output lines crossing each other, a plurality of cells respectively disposed at intersections of the input lines and the output lines, and a plurality of sense amplifiers respectively connected to the output lines, the method comprising:
   transforming a format of binary data of a plurality of weights from a floating-point format into a quantized format by truncating at least a portion of fraction bits of the binary data and calculating complements of remaining bits of the binary data, and programming the transformed binary data of the plurality of weights into the plurality of cells;
   performing a tuning procedure by iteratively inputting binary data of a plurality of input signals into the plurality of input lines, integrating outputs sensed by the sense amplifiers, and adjusting the binary data of the plurality of weights programmed into the cells based on the integrated outputs for a number of iterations; and
   reshaping the binary data of the plurality of weights based on a probability of reducing bits with a value of one in the binary data of each weight after the number of iteration, and repeating the tuning procedure until an end condition is met.

2. The method of claim 1, the step of calculating complements of remaining bits of the binary data comprises:
   calculating 2's complements of the remaining bits and reversing values of the calculated 2's complements.

3. The method of claim 1, the tuning procedure comprises training of a neural network, wherein the binary data of the plurality of input signals are set as inputs of the neural network, the plurality of weights are set as weights in a plurality of computing layers in the neural network, and the integrated outputs are set as outputs of the neural network.

4. The method of claim 3, the step of adjusting the binary data of the plurality of weights programmed into the cells based on the integrated outputs comprises:
   calculating differences between the integrated outputs and reference signals of the input signals, and adjusting the transformed binary data of the plurality of weights to be programmed into the cells according to the differences.

5. The method of claim 4, the step of reshaping the binary data of the plurality of weights based on a probability of reducing the bits with a value of one in the binary data of each weight comprises:
   calculating an accuracy according to the differences between the integrated outputs and reference signals of the input signals; and
   advancing the reshaping in response to the calculated accuracy being greater than a first threshold.

6. The method of claim 1, the step of reshaping the binary data of the plurality of weights based on a probability of reducing the bits with a value of one in the binary data of each weight comprises:
   calculating a ratio of the bits with a value of one and the bits with a value of zero in the binary data of the plurality of weights; and
   advancing the reshaping in response to the calculated ratio being greater than a second threshold.

7. The method of claim 1, the step of reshaping the binary data of the plurality of weights based on a probability of reducing the bits with a value of one in the binary data of each weight comprises:
   calculating the probability by shifting a decimal value of each weight by an arbitrary number to maximize a quotient of a reduction of bits with a value of one in the binary data of the weight and the shifted number, and dividing the quotient by a factor determined based on a data distribution of the plurality of weights; and
   shifting the decimal value of each weight according to the calculated probability in response to the quotient being larger than or equal to a threshold.

8. The method of claim 1, wherein the binary data of each weight with the floating-point format comprises one sign bit, eight exponent bits and twenty-three fraction bits in a 32-bit binary data.

9. An in-memory computing apparatus, comprising:
   a memory, comprising:
      a plurality of input lines and a plurality of output lines crossing each other;
      a plurality of cells respectively disposed at intersections of the input lines and the output lines; and
      a plurality of sense amplifiers respectively connected to the output lines;
   a processor, coupled to the memory and configured to:
      transform a format of binary data of a plurality of weights from a floating-point format into a quantized format by truncating at least a portion of fraction bits of the binary data and calculating complements of remaining bits of the binary data, and programming the transformed binary data of the plurality of weights into the plurality of cells;
      perform a tuning procedure by iteratively inputting binary data of a plurality of input signals into the plurality of input lines, integrate outputs sensed by the sense amplifiers, and adjust the binary data of the plurality of weights programmed into the cells based on the integrated outputs for a number of iterations; and
      reshape the binary data of the plurality of weights based on a probability of reducing bits with a value of one in the binary data of each weight after the number of iteration, and repeat the tuning procedure until an end condition is met.

10. The in-memory computing apparatus of claim 9, wherein the processor calculates 2's complements of the remaining bits and reverses values of the calculated 2's complements.

11. The in-memory computing apparatus of claim 9, the tuning procedure comprises training of a neural network, wherein the binary data of the plurality of input signals are set as inputs of the neural network, the plurality of weights are set as weights in a plurality of computing layers in the neural network, and the integrated outputs are set as outputs of the neural network.

12. The in-memory computing apparatus of claim 11, wherein the processor calculates differences between the integrated outputs and reference signals of the input signals, and adjusts the transformed binary data of the plurality of weights to be programmed into the cells according to the differences.

13. The in-memory computing apparatus of claim 12, wherein the processor calculates an accuracy according to the differences between the integrated outputs and reference signals of the input signals, and advances the reshaping in response to the calculated accuracy being greater than a first threshold.

14. The in-memory computing apparatus of claim 9, wherein the processor calculates a ratio of the bits with a value of one and the bits with a value of zero in the binary data of the plurality of weights, and advances the reshaping in response to the calculated ratio being greater than a second threshold.

15. The in-memory computing apparatus of claim 9, wherein the processor calculates the probability by shifting a decimal value of each weight by an arbitrary number to maximize a quotient of a reduction of bits with a value of one in the binary data of the weight and the shifted number, and dividing the quotient by a factor determined based on a data distribution of the plurality of weights, and shifting the decimal value of each weight according to the calculated probability in response to the quotient being larger than or equal to a threshold.

16. The in-memory computing apparatus of claim 9, the binary data of each weight with the floating-point format comprises one sign bit, eight exponent bits and twenty-three fraction bits in a 32-bit binary data.

* * * * *